(12) United States Patent
Park

(10) Patent No.: US 8,601,327 B2
(45) Date of Patent: Dec. 3, 2013

(54) SEMICONDUCTOR MEMORY DEVICE

(75) Inventor: Mun-Phil Park, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 458 days.

(21) Appl. No.: 12/944,156

(22) Filed: Nov. 11, 2010

(65) Prior Publication Data

US 2012/0054562 A1 Mar. 1, 2012

(30) Foreign Application Priority Data

Aug. 31, 2010 (KR) .................. 10-2010-0084689

(51) Int. Cl.
*G11C 29/00* (2006.01)
(52) U.S. Cl.
USPC .......................................... 714/710; 714/711
(58) Field of Classification Search
USPC .................................. 714/710, 711
See application file for complete search history.

(56) References Cited

U.S. PATENT DOCUMENTS

| | | | | |
|---|---|---|---|---|
| 4,586,178 A | * | 4/1986 | Bosse ........................... | 714/711 |
| 5,406,565 A | * | 4/1995 | MacDonald .................. | 714/711 |
| 5,781,717 A | * | 7/1998 | Wu et al. ...................... | 714/6.13 |
| 5,905,673 A | * | 5/1999 | Khan .......................... | 365/185.03 |
| 6,202,179 B1 | * | 3/2001 | Morzano ........................ | 714/710 |
| 6,532,181 B2 | * | 3/2003 | Saito et al. .................... | 365/200 |
| 6,560,728 B2 | * | 5/2003 | Merritt .......................... | 714/711 |
| 2002/0012282 A1 | * | 1/2002 | Saito et al. .................... | 365/200 |
| 2009/0080273 A1 | * | 3/2009 | Sohn .............................. | 365/200 |

FOREIGN PATENT DOCUMENTS

| | | |
|---|---|---|
| KR | 100188021 | 6/1999 |
| KR | 1020020002133 | 1/2002 |
| KR | 1020020013277 | 2/2002 |
| KR | 1020070055999 | 5/2007 |
| KR | 1020090030762 | 3/2009 |

OTHER PUBLICATIONS

Office Action issued by the Korean Intellectual Property Office on Jan. 13, 2012.
Office Action issued by the Korean Intellectual Property Office on Aug. 29, 2012.

* cited by examiner

*Primary Examiner* — Joshua Lohn
(74) *Attorney, Agent, or Firm* — IP & T Group LLP

(57) ABSTRACT

A semiconductor memory device having a bank including a redundancy cell block and a plurality of normal cell blocks includes a plurality of normal data inputting/outputting units configured to respectively input/output data from the normal cell blocks in response to a first input/output strobe signal, a redundancy data inputting/outputting unit configured to input/output data from the redundancy cell block in response to the first input/output strobe signal, and a connection selecting unit configured to selectively connect the normal data inputting/outputting units and the redundancy data inputting/outputting unit to a plurality of local data lines in response to a address.

26 Claims, 12 Drawing Sheets

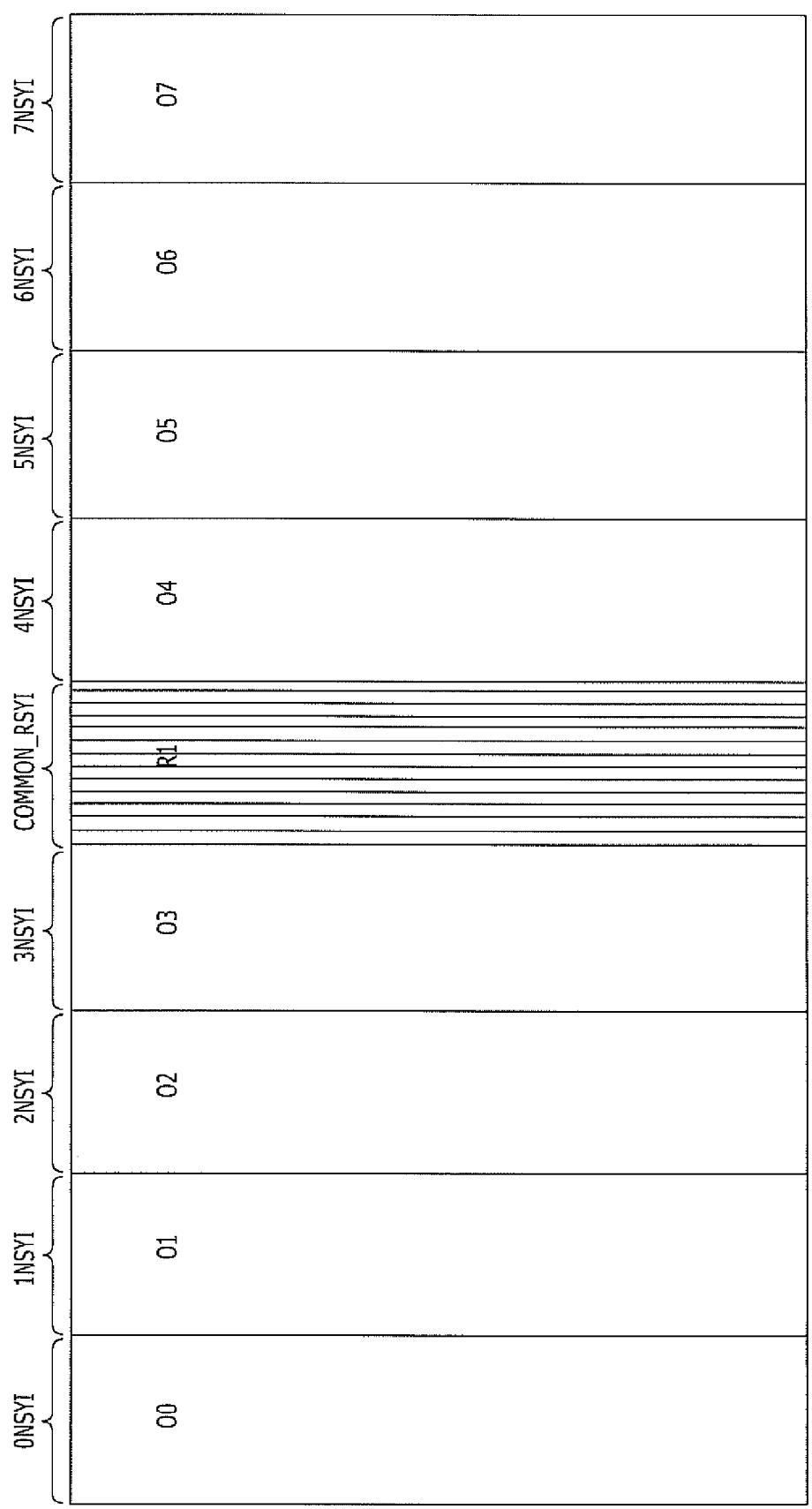

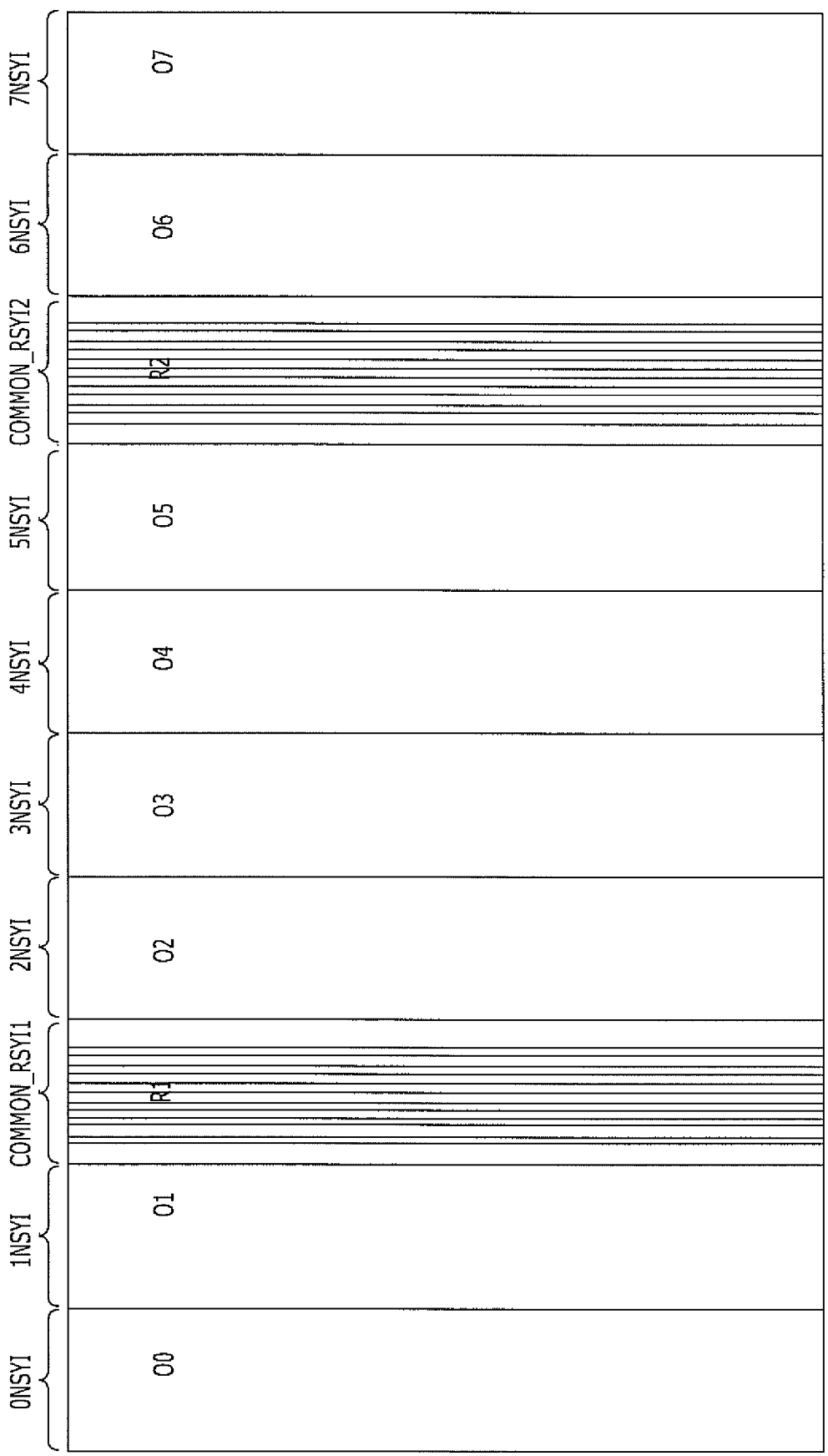

SEMICONDUCTOR MEMORY DEVICE

CROSS-REFERENCE(S) TO RELATED APPLICATIONS

The present application claims priority of Korean Patent Application No. 10-2010-0084689, filed on Aug. 31, 2010, which is incorporated herein by reference in its entirety.

BACKGROUND OF THE INVENTION

Exemplary embodiments of the present invention relate to semiconductor design technology, and more particularly, to a semiconductor memory device that improves column repair efficiency.

A semiconductor memory device such as a dynamic random access memory (DRAM) includes a number of memory cells. If any one of the memory cells has a defect, the semiconductor memory device malfunctions and is treated as a defective product. Furthermore, the recent trend toward the high integration and high speed of semiconductor memory devices increases the probability of the occurrence of such defective cells, thus reducing the wafer yield that is represented as the ratio of the number of non-defective chips to the number of all chips fabricated on a wafer and determines the fabrication costs. Accordingly, a method for correcting defective cells to increase the wafer yield of highly integrated memory devices is desirable.

FIG. 1 is a block diagram illustrating a conventional semiconductor memory device for performing a conventional defective cell column repair method.

Referring to FIG. 1, a conventional semiconductor memory device includes a plurality of column memory cell blocks O0, O1, O2, O3, O4, O5, O6, and O7 disposed in a column direction. Each of the column memory cell blocks O0, O1, O2, O3, O4, O5, O6, and O7 includes a plurality of normal column cell lines 0NSYI, 1NSYI, 2NSYI, 3NSYI, 4NSYI, 5NSYI, 6NSYI, and 7NSYI, and a plurality of redundancy column cell lines 0RSYI, 1RSYI, 2RSYI, 3RSYI, 4RSYI, 5RSYI, 6RSYI, and 7RSYI.

Thus, if a fail occurs in the normal column cell lines 0NSYI, 1NSYI, 2NSYI, 3NSYI, 4NSYI, 5NSYI, 6NSYI, and 7NSYI included in each of the column memory cell blocks O0, O1, O2, O3, O4, O5, O6, and O7, a redundancy operation is performed to repair the fail using the redundancy column cell lines 0RSYI, 1RSYI, 2RSYI, 3RSYI, 4RSYI, 5RSYI, 6RSYI, and 7RSYI included in the same column memory cell blocks O0, O1, O2, O3, O4, O5, O6, and O7.

However, if the number of normal column cell lines with a fail among the normal column cell lines 0NSYI, 1NSYI, 2NSYI, 3NSYI, 4NSYI, 5NSYI, 6NSYI, and 7NSYI included in each of the column memory cell blocks O0, O1, O2, O3, O4, O5, O6, and O7 is greater than the number of redundancy column cell lines 0RSYI, 1RSYI, 2RSYI, 3RSYI, 4RSYI, 5RSYI, 6RSYI, and 7RSYI included in the same column memory cell blocks O0, O1, O2, O3, O4, O5, O6, and O7, the conventional redundancy operation method cannot perform a normal repair operation.

In particular, even if free redundancy column cell lines are present in some of the column memory cell blocks O0, O1, O2, O3, O4, O5, O6, and O7, other cell blocks cannot share the free redundancy column cell lines. Therefore, the conventional redundancy operation method cannot perform a normal repair operation.

The disadvantages of the conventional redundancy operation may become a bigger concern as the technology of semiconductor memory devices advances (SDR-→DDR-→DDR2-→DDR3).

That is, because the number of pre-fetch bits increases as semiconductor memory device technology develops, the number of column memory cell blocks included in one bank increases. Accordingly, the number of redundancy column cell lines included in each column memory cell block decreases. Therefore, the number of normal column cell lines coverable in the event of the occurrence of a fail decreases. This undesirably reduces the possibility of performing a normal redundancy operation.

For reference, because an operation of repairing a row line in a general semiconductor memory device does not directly apply input/output data information, redundancy row cell lines can be directly shared among a plurality of row memory cell blocks.

However, because an operation of repairing a column line must directly apply input/output data information, redundancy column cell lines cannot be directly shared among a plurality of column memory cell blocks.

SUMMARY OF THE INVENTION

Exemplary embodiments of the present invention are directed to a semiconductor memory device that improves column repair efficiency by allowing a plurality of column memory cell blocks to share a redundancy column cell line.

In accordance with an exemplary embodiment of the present invention, a semiconductor memory device having a bank including a redundancy cell block and a plurality of normal cell blocks disposed in a column direction includes a plurality of normal data inputting/outputting units configured to respectively input/output data from the normal cell blocks in response to a first input/output strobe signal, a redundancy data inputting/outputting unit configured to input/output data from the redundancy cell block in response to the first input/output strobe signal, and a connection selecting unit configured to selectively connect the normal data inputting/outputting units and the redundancy data inputting/outputting unit to a plurality of local data lines in response to a column address.

The semiconductor memory device may also include a plurality of local data inputting/outputting units configured to respectively input/output data between the local data lines and a plurality of global data lines in response to a second input/output strobe signal.

In accordance with another exemplary embodiment of the present invention, a semiconductor memory device having K redundancy cell blocks and M normal cell blocks, M being a natural number and at least two times greater than K, includes M normal data inputting/outputting units configured to respectively input/output N-bit data from the M normal cell blocks in response to a first input/output strobe signal, K redundancy data inputting/outputting units configured to input/output N-bit data from the K redundancy cell block in response to the first input/output strobe signal, and a connection selecting unit configured to selectively connect the M normal data inputting/outputting units and the K redundancy data inputting/outputting units to {M×N} local data lines on an N-bit basis in response to a column address.

The semiconductor memory device may also include M local data inputting/outputting units configured to respectively input/output N-bit data between the {M×N} local data lines and {M×N} global data lines in response to a second input/output strobe signal.

In accordance with yet another exemplary embodiment of the present invention, a semiconductor memory device having a bank including a plurality of redundancy cell blocks and a plurality of normal cell block groups, each normal cell block group including a number of normal cell blocks, includes a plurality of normal data inputting/outputting groups configured to respectively input/output data from the normal cell block groups in response to a first input/output strobe signal, a plurality of redundancy data inputting/outputting units configured to input/output data from the redundancy cell blocks in response to the first input/output strobe signal, and a connection selecting unit configured to selectively connect the normal data inputting/outputting groups and the redundancy data inputting/outputting units to a plurality of local data line groups in response to a column address, wherein each of the local data line groups includes a predetermined number of local data lines.

The semiconductor memory device may also include a plurality of local data inputting/outputting groups configured to respectively input/output data between the local data line groups and a plurality of global data line groups in response to a second input/output strobe signal, wherein each of the global data line groups includes a number of global data lines.

BRIEF DESCRIPTION OF THE DRAWINGS

FIG. 2A is a block diagram illustrating a bank for performing a defective cell column repair method in accordance with an exemplary embodiment of the present invention.

FIG. 2B is a block diagram illustrating a bank for performing a defective cell column repair method in accordance with another exemplary embodiment of the present invention.

DESCRIPTION OF SPECIFIC EMBODIMENTS

Figure 1:
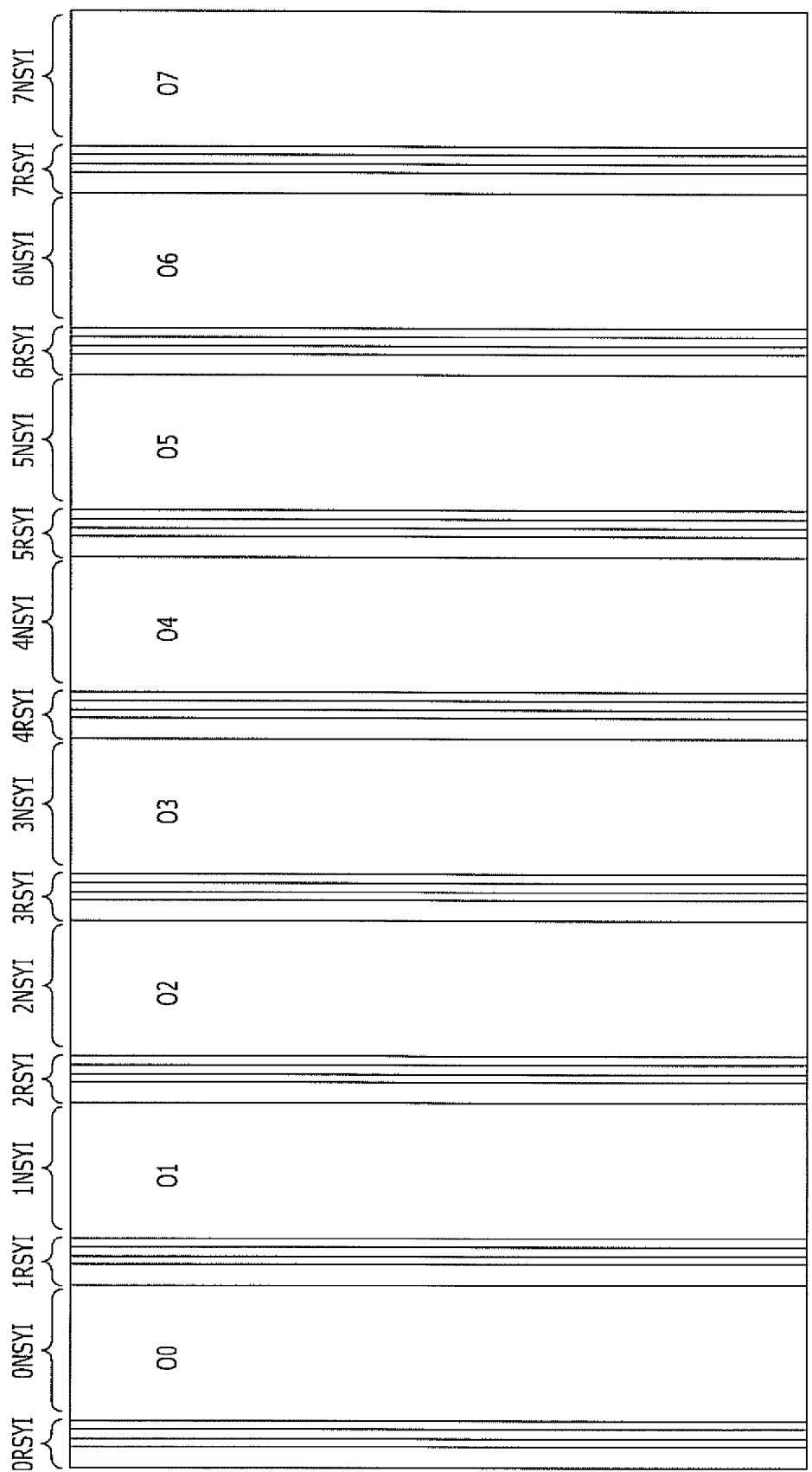
FIG. 1 is a block diagram illustrating a conventional semiconductor memory device for performing a conventional defective cell column repair method.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 2A is a block diagram of a bank for performing a defective cell column repair method in accordance with an exemplary embodiment of the present invention.

Referring to FIG. 2A, a bank of a semiconductor memory device in accordance with an exemplary embodiment of the present invention includes: a plurality of normal cell blocks O0, O1, O2, O3, O4, O5, O6, and O7 disposed in a column direction and respectively having a plurality of normal column cell lines 0NSYI, 1NSYI, 2NSYI, 3NSYI, 4NSYI, 5NSYI, 6NSYI, and 7NSYI; and one redundancy cell block R1 disposed between the normal cell blocks O0, O1, O2, O3, O4, O5, O6, and O7 and having a plurality of redundancy column cell lines COMMON_RSYI.

That is, in the bank of the semiconductor memory device in accordance with an exemplary embodiment of the present invention, the normal cell blocks O0, O1, O2, O3, O4, O5, O6, and O7 share one redundancy cell block R1 to perform a redundancy operation.

FIG. 2B is a block diagram of a bank for performing a defective cell column repair method in accordance with another exemplary embodiment of the present invention.

Referring to FIG. 2B, a bank of a semiconductor memory device in accordance with another exemplary embodiment of the present invention includes: a plurality of normal cell blocks O0, O1, O2, O3, O4, O5, O6, and O7 disposed in a column direction and respectively having a plurality of normal column cell lines 0NSYI, 1NSYI, 2NSYI, 3NSYI, 4NSYI, 5NSYI, 6NSYI, and 7NSYI; and two redundancy cell blocks R1 and R2 respectively having a plurality of redundancy column cell lines COMMON_RSYI1 and COMMON_RSYI2.

That is, in the bank of the semiconductor memory device in accordance with another exemplary embodiment of the present invention, the normal cell blocks O0, O1, O2, and O3 disposed on one side of the bank share the first redundancy cell block R1 to perform a redundancy operation, while the normal cell blocks O4, O5, O6, and O7 disposed on the other side of the bank share the second redundancy cell block R2 to perform a redundancy operation.

The bank structure of the semiconductor memory device illustrated in FIG. 2B has fewer normal cell blocks sharing one redundancy cell block than the bank structure of the semiconductor memory device illustrated in FIG. 2A. Therefore, when compared to the bank structure of the semiconductor memory device illustrated in FIG. 2A, the bank structure of the semiconductor memory device illustrated in FIG. 2B can reduce the size of a peripheral circuit necessary to input/output redundancy data when a redundancy cell block is shared. On the other hand, the bank structure of the semiconductor memory device illustrated in FIG. 2B has fewer redundancy column cell lines included in one redundancy cell block than the bank structure of the semiconductor memory device illustrated in FIG. 2A. Therefore, the bank structure of the semiconductor memory device illustrated in FIG. 2B has a lower column repair efficiency than the bank structure of the semiconductor memory device illustrated in FIG. 2A.

Although FIG. 2B illustrates that two redundancy cell blocks R1 and R2 are provided to support eight normal cell blocks O0, O1, O2, O3, O4, O5, O6, and O7, the present invention is not limited thereto. That is, two or more redundancy cell blocks may be provided to support eight or more normal cell blocks.

Figure 2C:
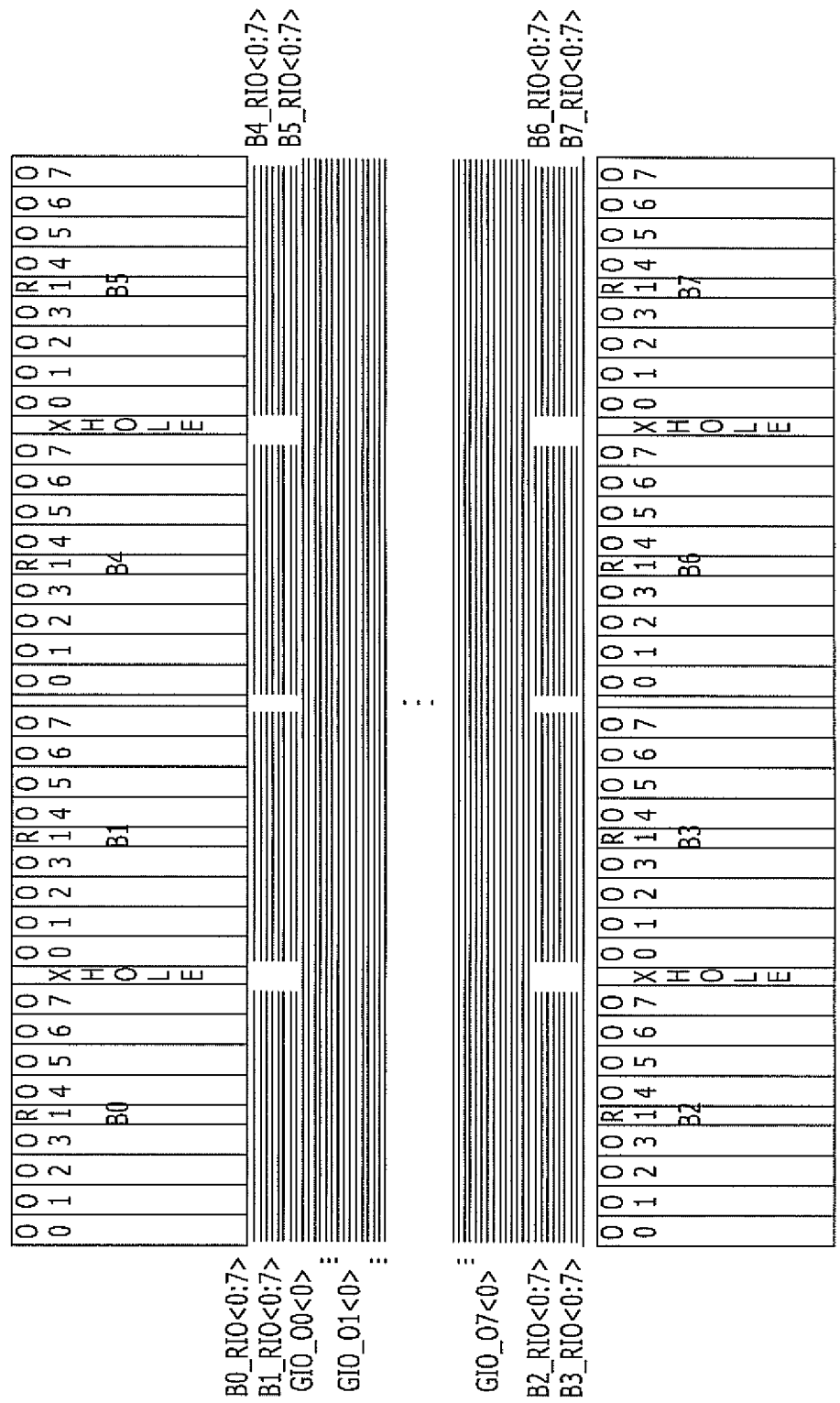
FIG. 2C is a block diagram of a semiconductor memory device for performing a defective cell column repair method in accordance with an exemplary embodiment of the present invention.

FIG. 2C is a block diagram of a semiconductor memory device for performing a defective cell column repair method in accordance with an exemplary embodiment of the present invention.

Referring to FIG. 2C, a semiconductor memory device in accordance with an exemplary embodiment of the present invention includes: a plurality of banks B0, B1, B2, B3, B4, B5, B6, and B7; a plurality of redundancy input/output lines B0_RIO<0:7>, B1_RIO<0:7>, B2_RIO<0:7>, B3_RIO<0:7>, B4_RIO<0:7>, B5_RIO<0:7>, B6_RIO<0:7>, and B7_RIO<0:7> provided respectively in the banks B0, B1, B2, B3, B4, B5, B6, and B7 to input/output redundancy data for the respective banks B0, B1, B2, B3, B4, B5, B6, and B7; and a plurality of global data input/output lines GIO_O0<0:7>, GIO_O1<0:7>, GIO_O2<0:7>, GIO_O3<0:7>, GIO_O4<0:7>, GIO_O5<0:7>, GIO_O6<0:7>, and GIO_O7<0:7> shared by the banks B0, B1, B2, B3, B4, B5, B6, and B7 to input/output normal data.

Herein, each of the banks B0, B1, B2, B3, B4, B5, B6, and B7 respectively includes: a plurality of normal cell blocks O0, O1, O2, O3, O4, O5, O6, and O7; and one redundancy cell block R1, as illustrated in FIG. 2A.

Figure 2D:
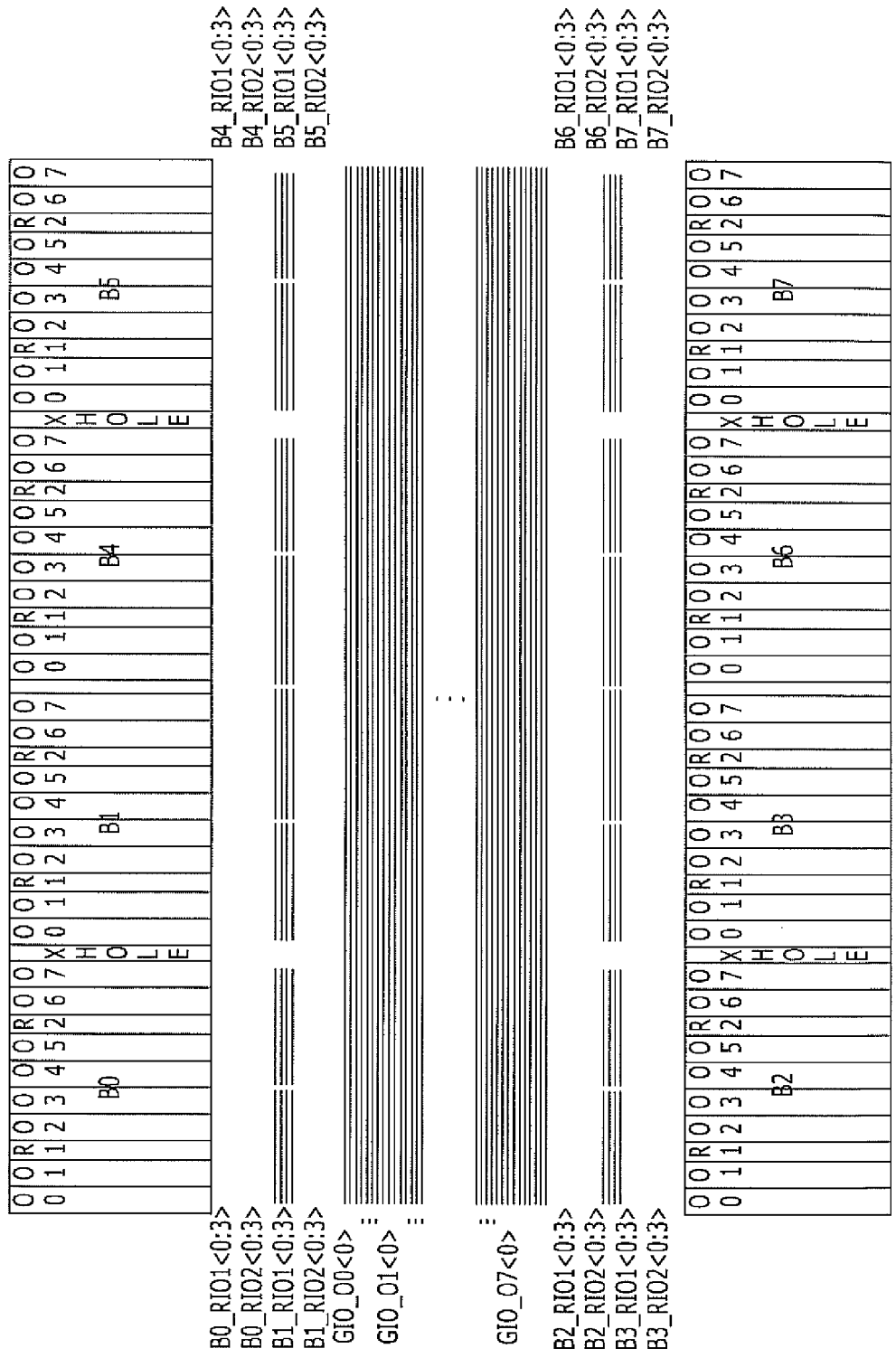
FIG. 2D is a block diagram of a semiconductor memory device for performing a defective cell column repair method in accordance with another exemplary embodiment of the present invention.

FIG. 2D is a block diagram of a semiconductor memory device illustrating a defective cell column repair method in accordance with another exemplary embodiment of the present invention.

Referring to FIG. 2D, a semiconductor memory device in accordance with another exemplary embodiment of the present invention includes: a plurality of banks B0, B1, B2, B3, B4, B5, B6, and B7; a plurality of redundancy input/output lines B0_RIO1<0:3>, B0_RIO2<0:3>, B1_RIO1<0:3>, B1_RIO2<0:3>, B2_RIO1<0:3>, B2_RIO2<0:3>, B3_RIO1<0:3>, B3_RIO2<0:3>, B4_RIO1<0:3>, B4_RIO2<0:3>, B5_RIO1<0:3>, B5_RIO2<0:3>, B6_RIO1<0:3>, B6_RIO2<0:3>, B7_RIO1<0:3>, and B7_RIO2<0:3> provided respectively in the banks B0, B1, B2, B3, B4, B5, B6, and B7 to input/output redundancy data independently corresponding to the number of redundancy cell blocks R1 and R2 provided in each of the banks B0, B1, B2, B3, B4, B5, B6 and B7; and a plurality of global data input/output lines GIO_O0<0:7>, GIO_O1<0:7>, GIO_O2<0:7>, GIO_O3<0:7>, GIO_O4<0:7>, GIO_O5<0:7>, GIO_O6<0:7>, and GIO_O7<0:7> shared by the banks B0, B1, B2, B3, B4, B5, B6, and B7 to input/output normal data.

Herein, each of the banks B0, B1, B2, B3, B4, B5, B6, and B7 respectively includes: a plurality of normal cell blocks O0, O1, O2, O3, O4, O5, O6, and O7; and two redundancy cell blocks R1 and R2, as illustrated in FIG. 2B.

Also, as described with reference to FIG. 2B, the total occupied area of a plurality of redundancy input/output lines B0_RIO1<0:3>, B0_RIO2<0:3>, B1_RIO1<0:3>, B1_RIO2<0:3>, B2_RIO1<0:3>, B2_RIO2<0:3>, B3_RIO1<0:3>, B3_RIO2<0:3>, B4_RIO1<0:3>, B4_RIO2<0:3>, B5_RIO1<0:3>, B5_RIO2<0:3>, B6_RIO1<0:3>, B6_RIO2<0:3>, B7_RIO1<0:3>, and B7_RIO2<0:3> is smaller by ½ times than that of the semiconductor memory device illustrated in FIG. 2C in accordance with an exemplary embodiment of the present invention.

Figure 3:
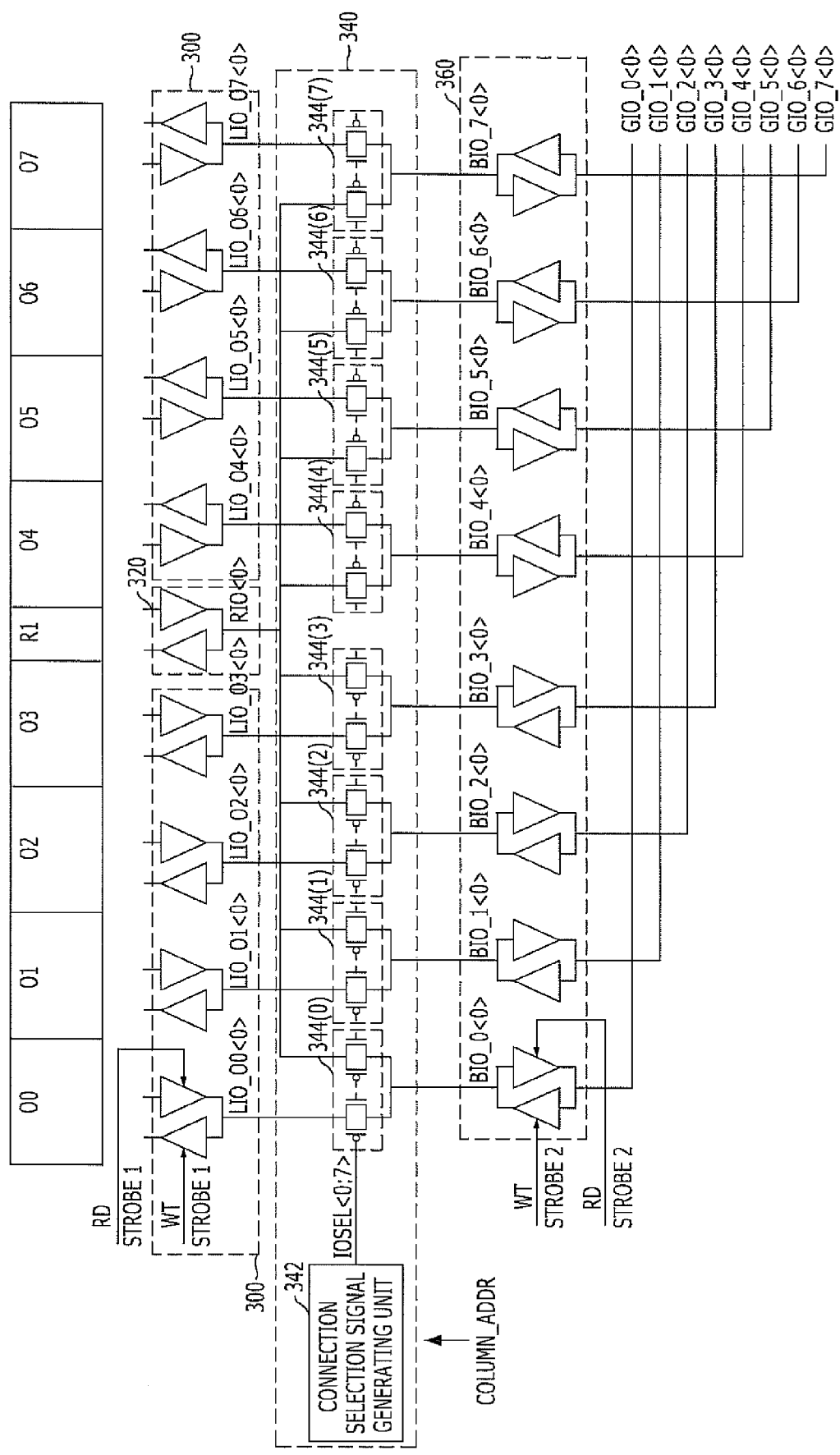
FIG. 3 is a circuit diagram illustrating a cell column repair circuit of a semiconductor memory device illustrated in FIG. 2A in accordance with an exemplary embodiment of the present invention.

FIG. 3 is a circuit diagram illustrating a cell column repair circuit of a semiconductor memory device illustrated in FIG. 2A in accordance with an exemplary embodiment of the present invention.

Referring to FIG. 3, a cell column repair circuit of a semiconductor memory device in accordance with an exemplary embodiment of the present invention, which has a bank including one redundancy cell block R1 and a plurality of normal cell blocks O0, O1, O2, O3, O4, O5, O6, and O7 disposed in a column direction, includes: a plurality of normal data inputting/outputting units 300 configured to respectively input/output data from the normal cell blocks O0, O1, O2, O3, O4, O5, O6, and O7 in response to first input/output strobe signals RD STROBE1 and WT STROBE1; a redundancy data inputting/outputting unit 320 configured to input/output data from the redundancy cell block R1 in response to the first input/output strobe signals RD STROBE1 and WT STROBE1; a connection selecting unit 340 configured to selectively connect the normal data inputting/outputting units 300 and the redundancy data inputting/outputting unit 320 to a plurality of local data lines BIO_0<0>, BIO_1<0>, BIO_2<0>, BIO_3<0>, BIO_4<0>, BIO_5<0>, BIO_6<0>, and BIO_7<0> in response to a column address COLUMN_ADDR; and a plurality of local data inputting/outputting units 360 configured to respectively input/output data between the local data lines BIO_0<0>, BIO_1<0>, BIO_2<0>, BIO_3<0>, BIO_4<0>, BIO_5<0>, BIO_6<0>, and BIO_7<0> and a plurality of global data lines GIO_0<0>, GIO_1<0>, GIO_2<0>, GIO_3<0>, GIO_4<0>, GIO_5<0>, GIO_6<0>, and GIO_7<0> in response to second input/output strobe signals RD STROBE2, WT STROBE2.

Herein, the normal data inputting/outputting units 300 input/output data between the normal cell blocks O0, O1, O2, O3, O4, O5, O6, and O7 and a plurality of normal data lines LIO_O0<0>, LIO_O1<0>, LIO_O2<0>, LIO_O3<0>, LIO_O4<0>, LIO_O5<0>, LIO_O6<0>, and LIO_O7<0> in response to the first input/output strobe signals RD STROBE1 and WT STROBE1.

Also, the redundancy data inputting/outputting unit 320 inputs/outputs data between the redundancy cell block R1 and a redundancy data line RIO<0> in response to the first input/output strobe signals RD STROBE1 and WT STROBE1.

The connection selecting unit 340 selects a repair target normal data line from among the normal data lines LIO_O0<0>, LIO_O1<0>, LIO_O2<0>, LIO_O3<0>, LIO_O4<0>, LIO_O5<0>, LIO_O6<0>, and LIO_O7<0> in response to the column address COLUMN_ADDR, and connects the normal data lines, except for the repair target normal data line, and the redundancy data line RIO<0> respectively to the local data lines BIO_0<0>, BIO_1<0>, BIO_2<0>, BIO_3<0>, BIO_4<0>, BIO_5<0>, BIO_6<0>, and BIO_7<0>.

Also, the connection selecting unit 340 includes: a connection selection signal generating unit 342 configured to generate a plurality of connection selection signals IOSEL<0:7> whose logic levels are determined corresponding to the column address COLUMN_ADDR; and a plurality of connection controlling units 344<0:7> configured to respectively connect any one of the redundancy data line RIO<0> and the normal data lines LIO_O0<0>, LIO_O1<0>, LIO_O2<0>, LIO_O3<0>, LIO_O4<0>, LIO_O5<0>, LIO_O6<0>, and LIO_O7<0> to the local data lines BIO_0<0>, BIO_1<0>, BIO_2<0>, BIO_3<0>, BIO_4<0>, BIO_5<0>, BIO_6<0>, and BIO_7<0> in response to the connection selection signals IOSEL<0:7>.

Also, the connection controlling units 344<0:7> are operated such that the normal data lines LIO_O0<0>, LIO_O1<0>, LIO_O2<0>, LIO_O3<0>, LIO_O4<0>, LIO_O5<0>, LIO_O6<0>, and LIO_O7<0> are connected respectively to a plurality of first input terminals, the redundancy data line RIO<0> is connected in common to a plurality of second input terminals, the local data lines BIO_0<0>, BIO_1<0>, BIO_2<0>, BIO_3<0>, BIO_4<0>, BIO_5<0>, BIO_6<0> and BIO_7<0> are connected respectively to a plurality of output terminals, any one of the output terminals is connected to the second input terminal in response to each of the connection selection signals IOSEL<0:7>, and the other output terminals are connected to the first input terminal. For example, when only the third signal IOSEL<3> among the connection selection signals IOSEL<0:7> is activated in the connection controlling units, all of the other connection selection signals IOSEL<0:2> and IOSEL<4:7> are deactivated. Accordingly, the second input terminal and the output terminal are connected only in the third connection controlling unit 344<3> among the connection controlling units 344<0:7>, so that the redundancy data line RIO<0> is connected to the third local data line BIO_3<0>. Meanwhile, the first input terminal and the output terminal are connected in the other $0^{th}$ to $2^{nd}$ connection controlling units 344<0:2> and the fourth to seventh connection controlling units 344<4:7>, so that the $0^{th}$ to $2^{nd}$ normal data lines LIO_O0<0>, LIO_O1<0>, and LIO_O2<0> and the fourth to seventh normal data lines LIO_O4<0>, LIO_O5<0>, LIO_O6<0>, and LIO_O7<0> are connected to the $0^{th}$ to $2^{nd}$ local data lines BIO_0<0>, BIO_1<0>, and BIO_2<0> and the fourth to seventh local data lines BIO_4<0>, BIO_5<0>, BIO_6<0>, and BIO_7<0>, respectively.

Figure 4:
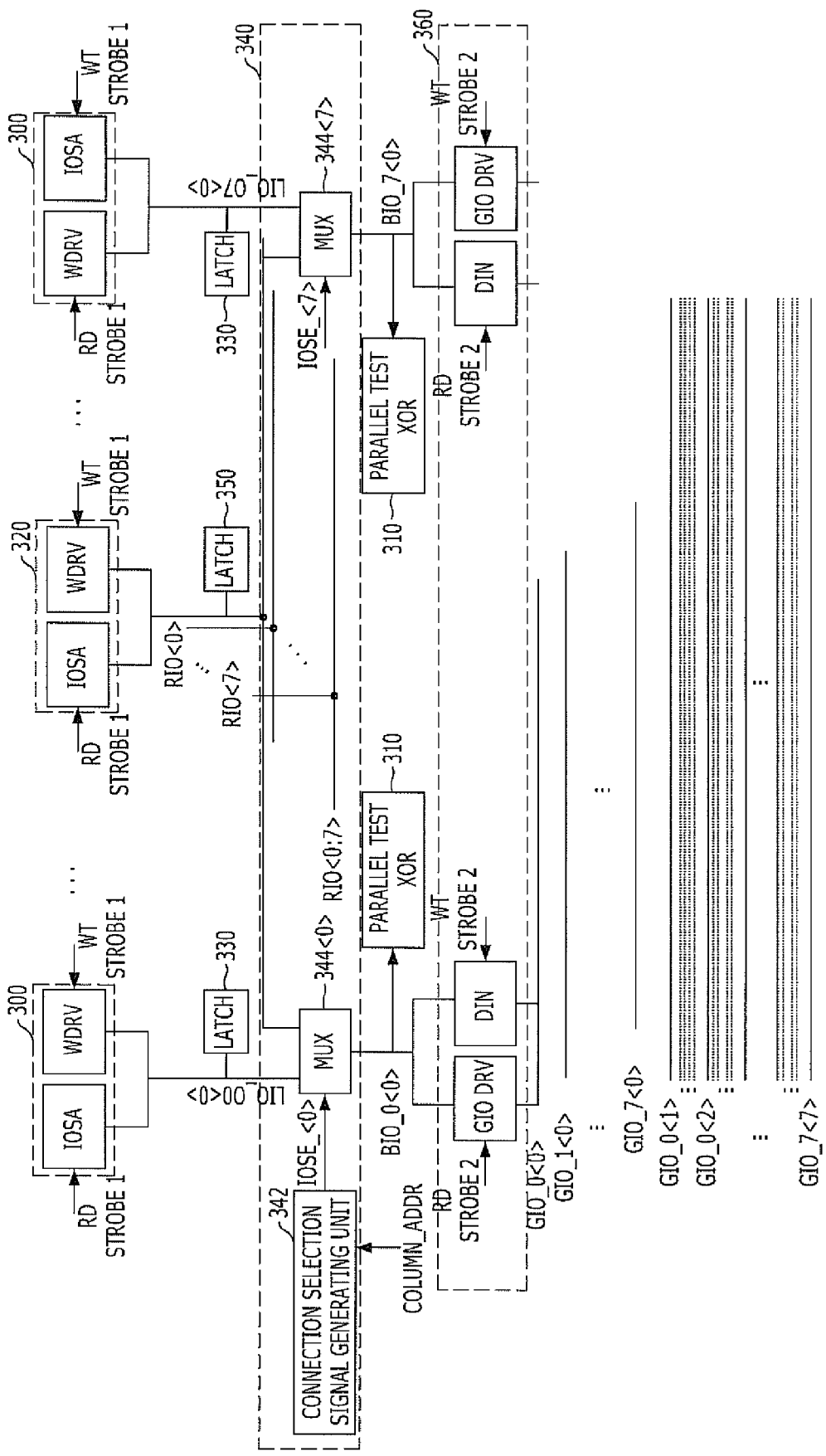
FIG. 4 is a block diagram illustrating a cell column repair circuit of a semiconductor memory device illustrated in FIG. 2A in accordance with an exemplary embodiment of the present invention.

FIG. 4 is a circuit diagram illustrating a cell column repair circuit of a semiconductor memory device illustrated in FIG. 2A in accordance with an exemplary embodiment of the present invention.

Referring to FIG. 4, a cell column repair circuit of a semiconductor memory device in accordance with an exemplary embodiment of the present invention, which has a bank including one redundancy cell block R1 and a plurality of normal cell blocks O0, O1, O2, O3, O4, O5, O6, and O7 disposed in a column direction, includes: a plurality of normal data inputting/outputting units 300 configured to respectively input/output data from the normal cell blocks O0, O1, O2, O3, O4, O5, O6, and O7 in response to first input/output strobe signals RD STROBE1 and WT STROBE1; a redundancy data inputting/outputting unit 320 configured to input/output data from the redundancy cell block R1 in response to the first input/output strobe signals RD STROBE1 and WT STROBE1; a connection selecting unit 340 configured to selectively connect the normal data inputting/outputting units 300 and the redundancy data inputting/outputting unit 320 to a plurality of local data lines BIO_0<0>, BIO_1<0>, BIO_2<0>, BIO_3<0>, BIO_4<0>, BIO_5<0>, BIO_6<0>, and BIO_7<0> in response to a column address COLUMN_ADDR; and a plurality of local data inputting/outputting units 360 configured to respectively input/output data between the local data lines BIO_0<0>, BIO_1<0>, BIO_2<0>, BIO_3<0>, BIO_4<0>, BIO_5<0>, BIO_6<0>, and BIO_7<0> and a plurality of global data lines GIO_0<0>, GIO_1<0>, GIO_2<0>, GIO_3<0>, GIO_4<0>, GIO_5<0>, GIO_6<0>, and GIO_7<0> in response to second input/output strobe signals RD STROBE2 and WT STROBE2.

Herein, the normal data inputting/outputting units 300 input/output data between the normal cell blocks O0, O1, O2, O3, O4, O5, O6, and O7 and a plurality of normal data lines LIO_O0<0>, LIO_O1<0>, LIO_O2<0>, LIO_O3<0>, LIO_O4<0>, LIO_O5<0>, LIO_O6<0>, and LIO_O7<0> in response to the first input/output strobe signals RD STROBE1 and WT STROBE1.

Also, the redundancy data inputting/outputting unit 320 inputs/outputs data between the redundancy cell block R1 and a redundancy data line RIO<0> in response to the first input/output strobe signals RD STROBE1 and WT STROBE1.

The connection selecting unit 340 selects a repair target normal data line among the normal data lines LIO_O0<0>, LIO_O1<0>, LIO_O2<0>, LIO_O3<0>, LIO_O4<0>, LIO_O5<0>, LIO_O6<0>, and LIO_O7<0> in response to the column address COLUMN_ADDR, and connects the normal data lines, except for the repair target normal data line, and the redundancy data line RIO<0> respectively to the local data lines BIO_0<0>, BIO_1<0>, BIO_2<0>, BIO_3<0>, BIO_4<0>, BIO_5<0>, BIO_6<0>, and BIO_7<0>.

Also, the connection selecting unit 340 includes: a connection selection signal generating unit 342 configured to generate a plurality of connection selection signals IOSEL<0:7> whose logic levels are determined corresponding to the column address COLUMN_ADDR; and a plurality of connection controlling units 344<0:7> configured to respectively connect any one of the redundancy data line RIO<0> and the normal data lines LIO_O0<0>, LIO_O1<0>, LIO_O2<0>, LIO_O3<0>, LIO_O4<0>, LIO_O5<0>, LIO_O6<0>, and LIO_O7<0> to the local data lines BIO_0<0>, BIO_1<0>, BIO_2<0>, BIO_3<0>, BIO_4<0>, BIO_5<0>, BIO_6<0>, and BIO_7<0> in response to the connection selection signals TOSEL<0:7>.

Additional elements, which are not illustrated in FIG. 3, are further provided as follows.

First, a compressive test operation unit 310 is connected respectively to the local data lines BIO_0<0>, BIO_1<0>, BIO_2<0>, BIO_3<0>, BIO_4<0>, BIO_5<0>, BIO_6<0>, and BIO_7<0> to compressively test the data of the local data lines in parallel.

Also, a plurality of normal data latch units 330 are connected respectively to the normal data lines LIO_O0<0>, LIO_O1<0>, LIO_O2<0>, LIO_O3<0>, LIO_O4<0>, LIO_O5<0>, LIO_O6<0>, and LIO_O7<0> to latch data carried in the normal data lines during a first time period corresponding to the input cycle of the column address COLUMN_ADDR. A redundancy data latch unit 350 is connected to the redundancy data line RIO<0> to latch data carried in the redundancy data line during the first time period.

Herein, the first time period is determined by counting clocks from a certain time point later than the input time point of the column address COLUMN_ADDR applied to the semiconductor memory device. This is described below in more detail with reference FIG. 5.

A common feature of both FIGS. 3 and 4, is that a plurality of normal data lines LIO_O0<0>, LIO_O1<0>, LIO_O2<0>, LIO_O3<0>, LIO_O4<0>, LIO_O5<0>, LIO_O6<0>, and LIO_O7<0> share one redundancy data line RIO<0> to perform a redundancy operation. Although, only one redundancy data line RIO<0> is shared in both FIGS. 3 and 4, it should be understood that a plurality of redundancy data lines RIO<0>, RIO<1>, RIO<2>, RIO<3>, RIO<4>, RIO<5>, RIO<6> and RIO<7> (more than one redundancy data RIO<0>) may be provided.

This means that more than eight normal data lines LIO_O0<0>, LIO_O1<0>, LIO_O2<0>, LIO_O3<0>, LIO_O4<0>, LIO_O5<0>, LIO_O6<0>, and LIO_O7<0> may be included. In the configuration of FIG. 4, it is assumed that the data input/output bandwidth of the semiconductor memory device is 'x8'. Thus, it can be understood that eight pairs of normal data lines LIO_O0<0:7>, LIO_O1<0:7>, LIO_O2<0:7>, LIO_O3<0:7>, LIO_O4<0:7>, LIO_O5<0:7>, LIO_O6<0:7>, and LIO_O7<0:7> and eight redundancy data lines RIO<0>, RIO<1>, RIO<2>, RIO<3>, RIO<4>, RIO<5>, RIO<6>, and RIO<7> are provided and a pair of normal data lines share one redundancy data line to perform a redundancy operation. It can be understood that eight pairs of global data lines GIO_0<0:7>, GIO_1<0:7>, GIO_2<0:7>, GIO_3<0:7>, GIO_4<0:7>, GIO_5<0:7>, GIO_6<0:7>, and GIO_7<0:7> are provided because eight pairs of normal data lines LIO_O0<0:7>, LIO_O1<0:7>, LIO_O2<0:7>, LIO_O3<0:7>, LIO_O4<0:7>, LIO_O5<0:7>, LIO_O6<0:7>, and LIO_O7<0:7> are provided.

As described above, the configuration of the semiconductor memory device illustrated in FIG. 3 may also extend in a similar manner as the configuration of the semiconductor memory device illustrated in FIG. 4. Thus, if the configuration of the normal data inputting/outputting unit 300, the redundancy data inputting/outputting unit 320, the connection selecting unit 340, and the local data inputting/outputting unit 350 illustrated in FIG. 3 are provided in eight pairs, then FIG. 3 becomes similar to FIG. 4.

Also, the configuration illustrated in FIG. 4 may extend as follows.

Referring to FIG. 4, a cell column repair circuit of a semiconductor memory device in accordance with an exemplary embodiment of the present invention, which has K redundancy cell blocks R1 to RK and M normal cell blocks O0, O1, O2, O3, O4, O5, O6, and O7 disposed in a column direction, includes: M normal data inputting/outputting units 300<0:7> configured to respectively input/output N-bit data from the M normal cell blocks O0, O1, O2, O3, O4, O5, O6, and O7 in response to first input/output strobe signals RD STROBE1 and WT STROBE1; K redundancy data inputting/outputting units 320 configured to input/output N-bit data from the K redundancy cell blocks R1 to RK in response to the first input/output strobe signals RD STROBE1 and WT STROBE1; a connection selecting unit 340 configured to selectively connect the M normal data inputting/outputting units 300<0:7> and the K redundancy data inputting/outputting units 320 to {M×N} local data lines BIO_0<0:7>, BIO_1<0:7>, BIO_2<0:7>, BIO_3<0:7>, BIO_4<0:7>, BIO_5<0:7>, BIO_6<0:7>, and BIO_7<0:7> on an N-bit basis in response to a column address COLUMN_ADDR; and M local data inputting/outputting units 360<0:7> configured to respectively input/output N-bit data between the {M×N} local data lines BIO_0<0:7>, BIO_1<0:7>, BIO_2<0:7>, BIO_3<0:7>, BIO_4<0:7>, BIO_5<0:7>, BIO_6<0:7>, and BIO_7<0:7> and {M×N} global data lines GIO_0<0:7>, GIO_1<0:7>, GIO_2<0:7>, GIO_3<0:7>, GIO_4<0:7>, GIO_5<0:7>, GIO_6<0:7>, and GIO_7<0:7> in response to second input/output strobe signals RD STROBE2 and WT STROBE2.

Herein, the connection selecting unit 340 selectively connects {M÷K} normal data inputting/outputting units 300<0:7> and one redundancy data inputting/outputting unit 320 to N local data lines BIO_M<0:7> on an N-bit basis.

The M normal data inputting/outputting units 300<0:7> respectively input/output N-bit data between the M normal cell blocks O0, O1, O2, O3, O4, O5, O6, and O7 and {M×N} normal data lines LIO_O0<0:7>, LIO_O1<0:7>, LIO_O2<0:7>, LIO_O3<0:7>, LIO_O4<0:7>, LIO_O5<0:7>, LIO_O6<0:7>, and LIO_O7<0:7> in response to the first input/output strobe signals RD STROBE1 and WT STROBE1.

Also, the K redundancy data inputting/outputting units 320 respectively input/output N-bit data between the K redundancy cell blocks R1 and {K×N} redundancy data lines RIO<0>, RIO<1>, RIO<2>, RIO<3>, RIO<4>, RIO<5>, RIO<6>, and RIO<7> in response to the first input/output strobe signals RD STROBE1 and WT STROBE1.

The connection selecting unit 340 selects 0 to {K×N} repair target normal data lines among the {M×N} normal data lines LIO_O0<0:7>, LIO_O1<0:7>, LIO_O2<0:7>, LIO_O3<0:7>, LIO_O4<0:7>, LIO_O5<0:7>, LIO_O6<0:7>, and LIO_O7<0:7> in response to the column address COLUMN_ADDR, and connects {(M−K)×N} normal data lines, except for the repair target normal data line and the redundancy data line corresponding to the repair target normal data line respectively to the {M×N} local data lines BIO_0<0:7>, BIO_1<0:7>, BIO_2<0:7>, BIO_3<0:7>, BIO_4<0:7>, BIO_5<0:7>, BIO_1<0:7>, and BIO_7<0:7>.

The connection selecting unit 340 includes: a connection selection signal generating unit 342 configured to generate M connection selection signals IOSEL<0:7> whose logic levels are determined corresponding to the column address COLUMN_ADDR; and M connection controlling units 344<0:7> configured to connect normal data lines other than the selected 0 to {K×N} repair target normal data lines from among the {M×N} normal data lines LIO_O0<0:7>, LIO_O1<0:7>, LIO_O2<0:7>, LIO_O3<0:7>, LIO_O4<0:7>, LIO_O5<0:7>, LIO_O6<0:7>, and LIO_O7<0:7> and the 0 to {K×N} redundancy data lines selected from among the {K×N} redundancy data lines RIO<0>, RIO<1>, RIO<2>, RIO<3>, RIO<4>, RIO<5>, RIO<6> and RIO<7>, respectively to the {M×N} local data lines BIO_0<0:7>, BIO_1<0:7>, BIO_2<0:7>, BIO_3<0:7>, BIO_4<0:7>, BIO_5<0:7>, BIO_6<0:7>, and BIO_7<0:7> on a N-bit basis, in response to the M connection selection signals IOSEL<0:7>.

The M connection controlling units 344<0:7> are configured such that the {M×N} normal data lines LIO_O0<0:7>, LIO_O1<0:7>, LIO_O2<0:7>, LIO_O3<0:7>, LIO_O4<0:7>, LIO_O5<0:7>, LIO_O6<0:7>, and LIO_O7<0:7> are connected respectively to M first input terminals on a N-bit basis, the {K×N} redundancy data lines RIO<0>, RIO<1>, RIO<2>, RIO<3>, RIO<4>, RIO<5>, RIO<6>, and RIO<7> are connected respectively to M second input terminals on a N-bit basis, wherein {M×K} second input terminals share one redundancy data line, the {M×N} local data lines BIO_0<0:7>, BIO_1<0:7>, BIO_2<0:7>, BIO_3<0:7>, BIO_4<0:7>, BIO_5<0:7>, BIO_6<0:7>, and BIO_7<0:7> are connected respectively to M output terminals on a N-bit basis, the 0 to K output terminals among the M output terminals are connected to the second input terminal on a N-bit basis in response to the M connection selection signals IOSEL<0:7>, and the other output terminals are connected to the first input terminal on a N-bit basis. For example, when only the third signal IOSEL<3> among the connection selection signals IOSEL<0:7> is activated in the connection controlling units 344<0:7>, all of the other connection selection signals IOSEL<0:2> and IOSEL<4:7> are deactivated. Accordingly, the second input terminal and the output terminal are connected only in the third connection controlling unit 344<3> among the connection controlling units 344<0:7>, so that the redundancy data lines RIO<0>, RIO<1>, RIO<2>, RIO<3>, RIO<4>, RIO<5>, RIO<6>, and RIO<7> are connected to the third local data line BIO_3<0:7> on an 8-bit basis. Also, the first input terminal and the output terminal are connected in the other $0^{th}$ to $2^{nd}$ connection controlling units 344<0:2> and the fourth to seventh connection controlling units 344<4:7>, so that the $0^{th}$ to $2^{nd}$ normal data lines LIO_O0<0:7>, LIO_O1<0:7>, and LIO_O2<0:7> and the fourth to seventh normal data lines LIO_O4<0:7>, LIO_O5<0:7>, LIO_O6<0:7>, and LIO_O7<0:7> are respectively connected to the $0^{th}$ to $2^{nd}$ local data lines BIO_0<0:7>, BIO_1<0:7>, and BIO_2<0:7> and the fourth to seventh local data lines BIO_4<0:7>, BIO_5<0:7>, BIO_6<0:7>, and BIO_7<0:7> on an 8-bit basis.

A compressive test operation unit 310 is connected respectively to the {M×N} local data lines BIO_0<0:7>, BIO_1<0:7>, BIO_2<0:7>, BIO_3<0:7>, BIO_4<0:7>, BIO_5<0:7>, BIO_6<0:7>, and BIO_7<0:7> to compressively test the data of the local data lines in parallel.

Furthermore, {M×N} normal data latch units 330 are connected respectively to the {M×N} normal data lines LIO_O0<0:7>, LIO_O1<0:7>, LIO_O2<0:7>, LIO_O3<0:7>, LIO_O4<0:7>, LIO_O5<0:7>, LIO_O6<0:7>, and LIO_O7<0:7> to latch data carried in the normal data lines LIO_O0<0:7>, LIO_O1<0:7>, LIO_O2<0:7>, LIO_O3<0:7>, LIO_O4<0:7>, LIO_O5<0:7>, LIO_O6<0:7>, and LIO_O7<0:7> during a first time period corresponding to the input cycle of the column address COLUMN_ADDR, which is determined by counting clocks from a predetermined time point later than the input time point of the column address. {K×N} redundancy data latch units 350 are connected respectively to the {K×N} redundancy data lines RIO<0>, RIO<1>, RIO<2>, RIO<3>, RIO<4>, RIO<5>, RIO<6>, and RIO<7> to latch data carried in the redundancy data line RIO<0> during the first time period.

Herein, 'M' is a natural number and is at least two times greater than 'K'. In the configuration of FIG. 4, 'M' is 8 and 'K' is 1. Also, 'N' is the size of the data input/output bandwidth of the semiconductor memory device. In the configuration of FIG. 4, 'N' is 8.

The reason for using the variables 'M','K' and 'N' to describe the cell column repair circuit of the semiconductor memory device in accordance with an exemplary embodiment of the present invention is that the variables 'M','K' and 'N' may also be applicable in the cell column repair circuit of the semiconductor memory device illustrated in FIGS. 2B and 2D in accordance with another exemplary embodiment of the present invention. That is the cell column repair circuit of the semiconductor memory device illustrated in FIGS. 2B and 2D in accordance with another exemplary embodiment of the present invention may be configured to have a value 'M' of 8, a value 'K' of 2, and a value 'N' of 8, as illustrated in FIG. 4.

Figure 5:
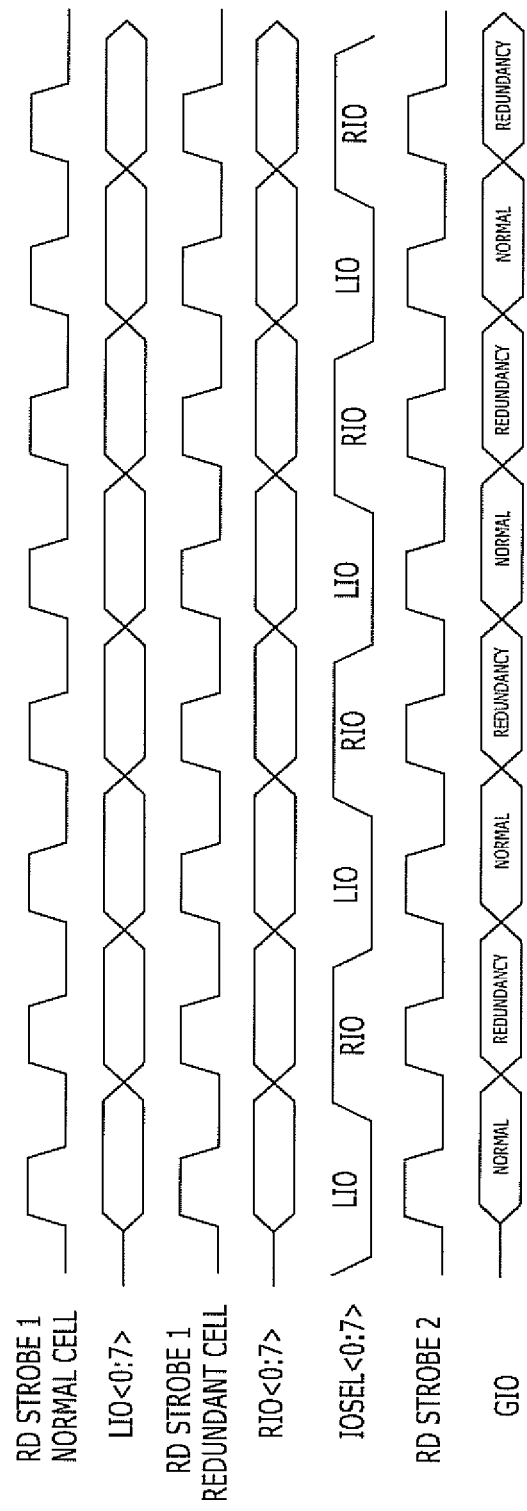
FIG. 5 is a timing diagram illustrating an operation of a cell column repair circuit of a semiconductor memory device illustrated in FIGS. 3 and 4 in accordance with an exemplary embodiment of the present invention.

FIG. 5 is a timing diagram illustrating an operation of a cell column repair circuit of a semiconductor memory device illustrated in FIGS. 3 and 4 in accordance with an exemplary embodiment of the present invention.

Referring to FIG. 5, the cell column repair circuit of the semiconductor memory device in accordance with an exemplary embodiment of the present invention starts to operate through an operation of determining the logic level of connection selection signals IOSEL<0:7> as logic 'High' or logic 'Low' in response to the column address COLUMN_ADDR. Herein, the first time period during which the connection selection signals IOSEL<0:7> maintain its logic levels 'High' or 'Low' corresponds to the input cycle of the column address COLUMN_ADDR. For example, if the column address COLUMN_ADDR is inputted at every four clock cycles (4 tck), the logic levels of the connection selection signals IOSEL<0:7> are also determined at every four clock cycles (4 tck).

Independently of the operation of determining the logic levels of the connection selection signals IOSEL<0:7> in response to the column address COLUMN_ADDR, the first strobe signal RD STROBE1 is activated during a second time period from a certain time point later than the input time point of the column address COLUMN_ADDR to operate the normal data inputting/outputting unit 300 and the redundancy data inputting/outputting unit 320. That is, the first strobe signal RD STROBE1 is activated during a second time period at every input cycle of the column address COLUMN_ADDR, wherein the second time period is shorter than the first time period and is determined by counting clocks from a certain time point later than the input time point of the column address COLUMN_ADDR. For example, when one clock cycle 1 tck elapses after the application of the column address COLUMN_ADDR, the first strobe signal RD STROBE1 changes from a deactivated state to an activated state. Thereafter, the first strobe signal RD STROBE1 maintains an activated state during two clock cycles 2 tck and then changes into a deactivated state.

Thus, as illustrated in FIG. 5, the first strobe signal RD STROBE1 maintains an activated state with a sufficient margin after determination of the logic levels of the connection selection signals IOSEL<0:7>, and the logic levels of the connection selection signals IOSEL<0:7> change with a sufficient margin after a deactivated state. Therefore, the normal data inputting/outputting unit 300 and the redundancy data inputting/outputting unit 320 can always operate with a stable margin.

Independent of the operation of determining the logic levels of the connection selection signals IOSEL<0:7> in response to the column address COLUMN_ADDR, the second strobe signal RD STROBE2 is activated during a second time period from a certain time point later than the input time point of the column address COLUMN_ADDR to operate the local data inputting/outputting unit 360. Herein, the second strobe signal RD STROBE2 is activated during a second time period at the same time point as the first strobe signal RD STROBE1 or at the later time point than the first strobe signal RD STROBE1. That is, the second strobe signal RD STROBE2 is activated during the second time period at every input cycle of the column address COLUMN_ADDR, wherein the activation time point of the second strobe signal RD STROBE2 is identical to or later than the activation time point of the first strobe signal RD STROBE1. For example, when one clock cycle 1 tck elapses after the application of the column address COLUMN_ADDR, the second strobe signal RD STROBE2 changes from a deactivated state to an activated state, Thereafter, the second strobe signal RD STROBE2 maintains an activated state during two clock cycles 2 tck and then changes into a deactivated state.

Thus, as illustrated in FIG. 5, the second strobe signal RD STROBE2 maintains an activated state with a sufficient margin after determination of the logic levels of the connection selection signals IOSEL<0:7>, and the logic levels of the connection selection signals IOSEL<0:7> change with a sufficient margin after a deactivated state. Therefore, the local data inputting/outputting unit 360 can always operate with a stable margin. Also, because the activation period of the first strobe signal RD STROBE1 is identical to or later than the activation period of the second strobe signal RD STROBE2, the normal data inputting/outputting unit 300, the redundancy data inputting/outputting unit 320 and the local data inputting/outputting unit 360 can operate in coordination.

Figure 6:
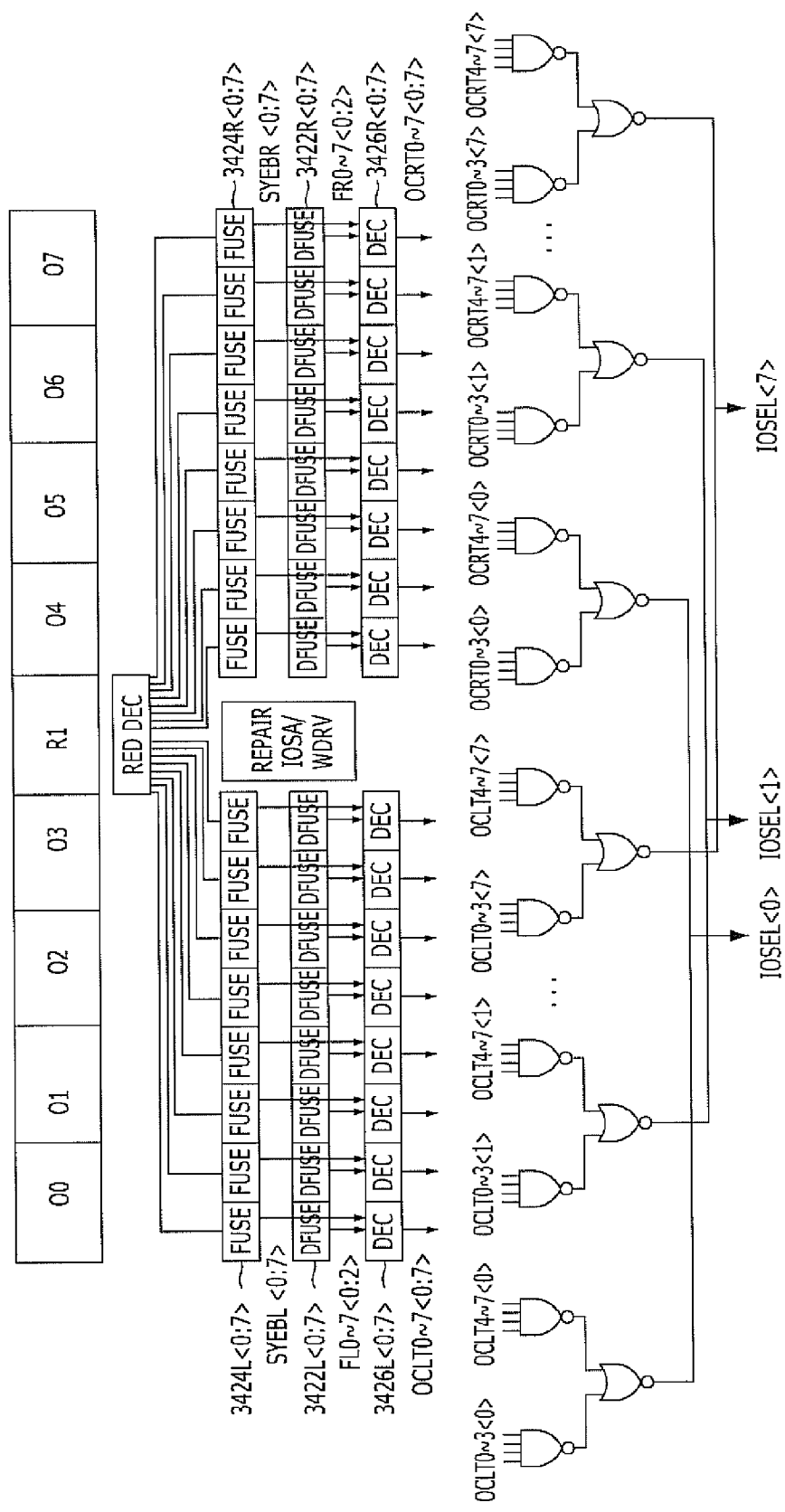
FIG. 6 is a circuit diagram illustrating a circuit for generating a connection selection signal for controlling an operation of a cell column repair circuit of a semiconductor memory device illustrated in FIGS. 3 and 4 in accordance with an exemplary embodiment of the present invention.

FIG. 6 is a circuit diagram illustrating a circuit for generating a connection selection signal for controlling an operation of a cell column repair circuit of a semiconductor memory device illustrated in FIGS. 3 and 4 in accordance with an exemplary embodiment of the present invention.

Referring to FIG. 6, the connection selection signal generating unit 342 includes: a plurality of cell block selecting units 3422L<0:7> and 3422R<0:7> configured to respectively select a plurality of repair target normal cell blocks among the normal cell blocks O0, O1, O2, O3, O4, O5, O6 and O7 corresponding to a plurality of redundancy cell lines RSYIL<0:7> and RSYIR<0:7> included in the redundancy cell block R1; a plurality of cell line selecting units 3424L<0:7> and 3424R<0:7> configured to compare the column address COLUMN_ADDR and a repair target column address COLUMN_ADDR and to respectively select a plurality of repair target normal cell lines corresponding to a plurality of redundancy cell lines RSYIL<0:7> and RSYIR<0:7> included in the redundancy cell block R1, among a plurality of normal cell lines NSYI<D:L> included in each of the normal cell blocks O0, O1, O2, O3, O4, O5, O6, and O7, according to the comparison results; and a plurality of connection selection signal outputting units 3426L<0:7> and 3426R<0:7> configured to respectively determine the logic levels of the connection selection signals IOSEL<0:7> in response to the output signals SYEBL<O>, SYEBL<1>, SYEBL<2>, SYEBL<3>, SYEBL<4>, SYEBL<5>, SYEBL<6>, SYEBL<7>, SYEBR<0>, SYEBR<1>, SYEBR<2>, SYEBR<3>, SYEBR<4>, SYEBR<5>, SYEBR<6>, and SYEBR<7> of the cell line selecting units 3424L<0:7> and 3424R<0:7> and to the output signals FL0<0:2>, FL1<0:2>, FL2<0:2>, FL3<0:2>, FL4<0:2>, FL5<0:2>, FL6<0:2>, FL7<0:2>, FR0<0:2>, FR1<0:2>, FR2<0:2>, FR3<0:2>, FR4<0:2>, FR5<0:2>, FR6<0:2>, and FR7<0:2> of the cell block selecting units 3422L<0:7> and 3422R<0:7>.

Figure 7:
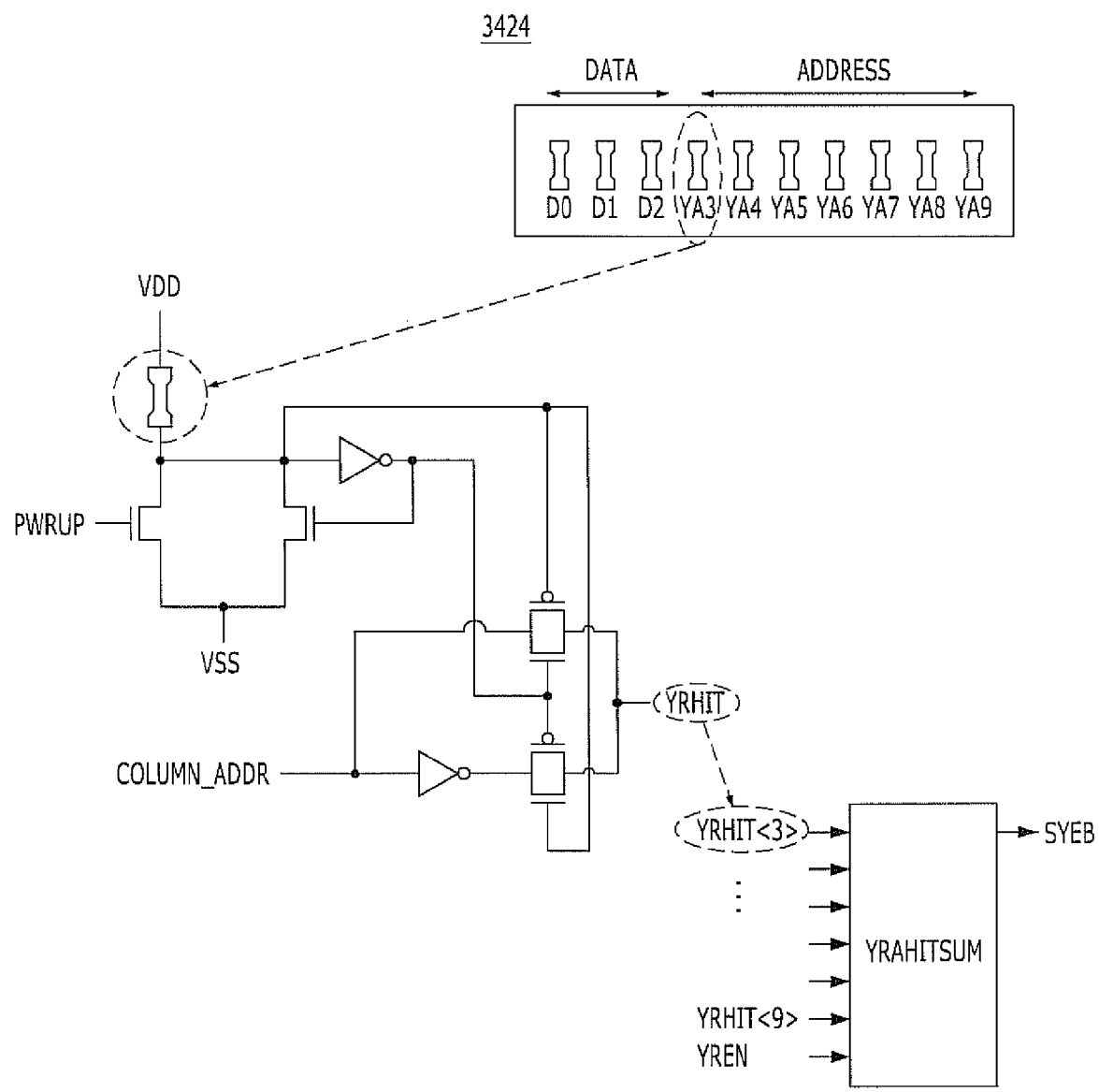
FIG. 7 is a circuit diagram illustrating a cell line selecting unit of a connection selection signal generating circuit illustrated in FIG. 6.

Among the configuration of the connection selection signal generating unit 342, the configuration of the cell line selecting units 3424L<0:7> and 3424R<0:7> use a fuse selection method, as illustrated in FIG. 7. That is, whether to cut or not cut address fuses ADDRESS FUSE<3:9> included in the cell line selecting units 3424L<0:7> and 3424R<0:7> is predetermined to determine which of the normal cell lines NSYI<0:L> is repaired by the redundancy cell lines RSYIL<0:7> and RSYIR<0:7>.

Figure 8:
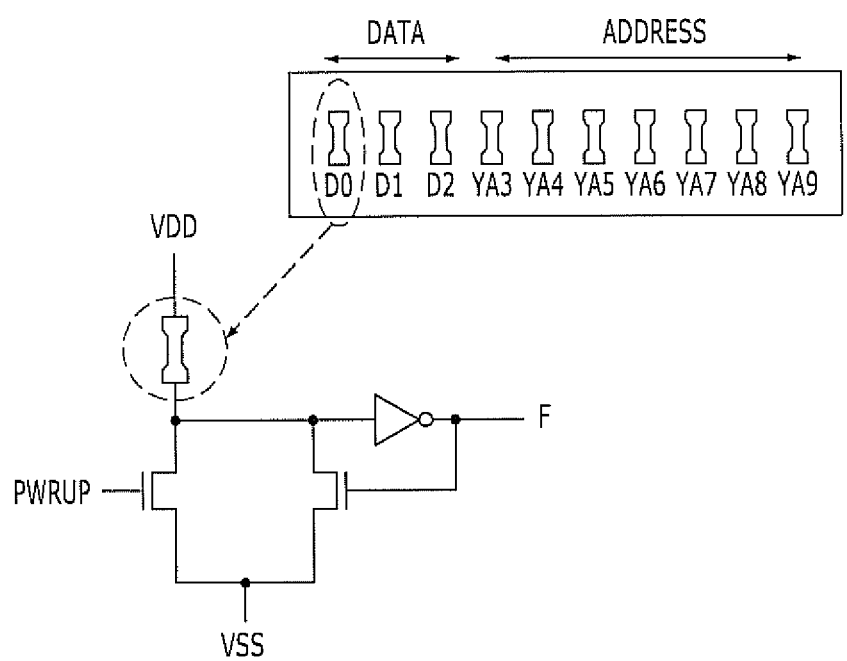
FIG. 8 is a circuit diagram illustrating a cell block selecting unit of a connection selection signal generating circuit illustrated in FIG. 6.

Among the configuration of the connection selection signal generating unit 340, the cell block selecting units 3422L<0:7> and 3422R<0:7> are used to determine the normal cell line of which of the normal cell blocks O0, O1, O2, O3, O4, O5, O6, and O7 is repaired through fuse selection by the redundancy cell lines RSYIL<0:7> and RSYIR<0:7>. Referring to FIG. 8, it can be seen that the values of the output signals FL<0:7> and FR<0:7> are directly determined through fuse selection when a power-up signal PWRUP is activated. Herein, the types of normal cell blocks repaired by the redundancy cell lines RSYIL<0:7> and RSYIR<0:7> may overlap each other. For example, all of the redundancy cell lines RSYIL<0:7> and RSYIR<0:7> may be used to repair only one normal cell block.

Figure 9:
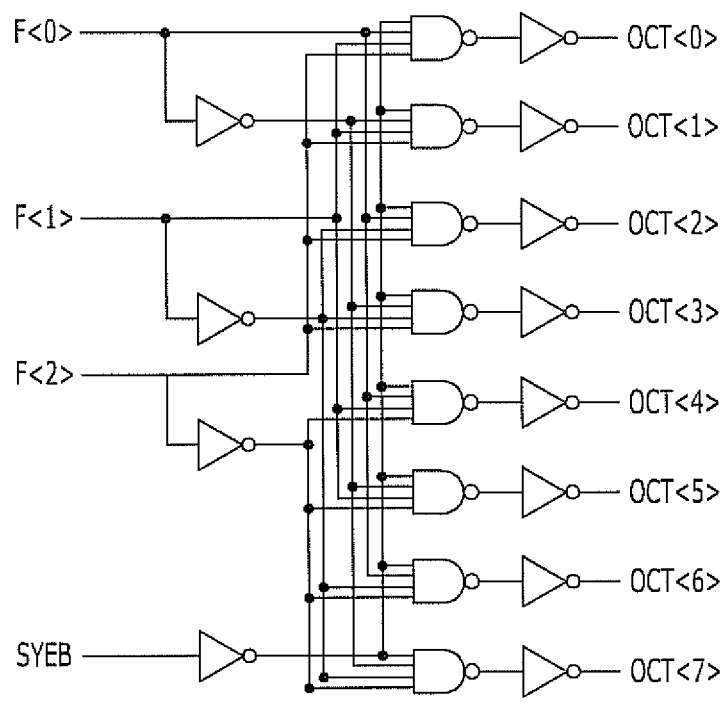
FIG. 9 is a circuit diagram illustrating a connection selection signal outputting unit of a connection selection signal generating circuit illustrated in FIG. 6.

Referring to FIG. 9, the connection selection signal outputting units 3426L<0:7> and 3426R<0:7> generates the connection selection signals IOSEL<0:7> for directly controlling the redundancy cell lines RSYIL<0:7> and RSYIR<0:7> by mixing the repair target normal cell block information caused by the operation of the cell block selecting units 3422L<0:7> and 3422R<0:7> and the repair target normal cell line information caused by the operation of the cell line selecting units 3424L<0:7> and 3424R<0:7>.

As described above, according to the exemplary embodiments of the present invention, the redundancy cell blocks having only the redundancy cell lines are separately provided in addition to the normal column memory cell blocks, so that all of the normal column memory cell blocks can share the redundancy column cell block to perform a redundancy operation. That is, the column memory cell blocks can share the redundancy column cell lines. Accordingly, the column repair efficiency can be improved significantly.

Also, because there is no need to include redundancy column cell lines in each normal column memory cell block, it is possible to prevent an increase in the occupied area of the semiconductor memory device.

The yield according to exemplary embodiments of the present invention increases up to 92% (80% in the conventional method) and the number of dies acquired according to the exemplary embodiments of the present invention increases to 1464 (1353 in the conventional method).

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device having a bank including a redundancy cell block and a plurality of normal cell blocks, the semiconductor memory device comprising:
   a plurality of normal data inputting/outputting units configured to respectively input/output data from the normal cell blocks in response to a first input/output strobe signal;
   a redundancy data inputting/outputting unit configured to input/output data from the redundancy cell block in response to the first input/output strobe signal;
   a connection selecting unit configured to selectively connect the normal data inputting/outputting units and the redundancy data inputting/outputting unit to a plurality of local data lines in response to an address; and
   a compressive test operation unit connected respectively to the plurality of local data lines to compressively test data of the plurality of local data lines in parallel.

2. The semiconductor memory device of claim 1, further comprising a plurality of local data inputting/outputting units configured to respectively input/output data between the local data lines and a plurality of global data lines in response to a second input/output strobe signal.

3. The semiconductor memory device of claim 2, wherein the normal data inputting/outputting units input/output data between the normal cell blocks and a plurality of normal data lines in response to the first input/output strobe signal.

4. The semiconductor memory device of claim 3, wherein the redundancy data inputting/outputting unit inputs/outputs data between the redundancy cell block and a redundancy data line in response to the first input/output strobe signal.

5. The semiconductor memory device of claim 4, wherein the connection selecting unit selects a repair target normal data line from among the normal data lines in response to the address, and connects the normal data lines, except for the repair target normal data line, and the redundancy data line respectively to the local data lines.

6. The semiconductor memory device of claim 5, wherein the connection selecting unit comprises:
   a connection selection signal generating unit configured to generate a plurality of connection selection signals having logic levels according to the address; and a plurality of connection controlling units configured to respectively connect any one of the redundancy data line and the normal data lines to the local data lines in response to the connection selection signals.

7. The semiconductor memory device of claim 6, wherein the connection selection signal generating unit comprises:
   a plurality of cell block selecting units configured to respectively select a plurality of repair target normal cell blocks from among the normal cell blocks corresponding to a plurality of redundancy cell lines included in the redundancy cell block;
   a plurality of cell line selecting units configured to compare the address and a repair target address and to respectively select a plurality of repair target normal cell lines, corresponding to a plurality of redundancy cell lines included in the redundancy cell block, from among a plurality of normal cell lines included in each of the normal cell blocks, according to the comparison results; and
   a plurality of connection selection signal outputting units configured to respectively determine the logic levels of the connection selection signals in response to the output signals of the cell line selecting units and the cell block selecting units.

8. The semiconductor memory device of claim 6, wherein the connection controlling units comprise:
   a plurality of first input terminals connected to the normal lines, respectively;
   a plurality of second input terminals connected in common to the redundancy data line; and
   a plurality of output terminals connected to the local data lines, respectively,
   wherein any one of the output terminals is connected to the respective second input terminal in response to each of the connection selection signals, and the other output terminals are connected to the first input terminal.

9. The semiconductor memory device of claim 5, further comprising:
   a plurality of normal data latch units connected respectively to the normal data lines to latch data carried in the normal data lines during a first time period corresponding to the input cycle of the address, which is determined by counting clocks from a time point later than the input time point of the address; and
   a redundancy data latch unit connected to the redundancy data line to latch data carried in the redundancy data line during the first time period.

10. The semiconductor memory device of claim 9, wherein the first strobe signal is activated during a second time period in each input cycle of the address, which is shorter than the first time period and is determined by counting clocks from a time point later than the input time point of the address, to operate the normal data inputting/outputting units and the redundancy data inputting/outputting unit; and
    the second strobe signal is activated at the same time point as the first strobe signal or at the later time point than the first strobe signal during the second time period in each input cycle of the address to operate the local data inputting/outputting units.

11. A semiconductor memory device having K redundancy cell blocks and M normal cell blocks, M being a natural number and at least two times greater than K, the semiconductor memory device comprising:
    M normal data inputting/outputting units configured to respectively input/output N-bit data from the M normal cell blocks in response to a first input/output strobe signal;
    K redundancy data inputting/outputting units configured to input/output N-bit data from the K redundancy cell block in response to the first input/output strobe signal;
    a connection selecting unit configured to selectively connect the M normal data inputting/outputting units and the K redundancy data inputting/outputting units to {M×N} local data lines on an N-bit basis in response to an address; and
    a compressive test operation unit connected respectively to the {M×N} local data lines to compressively test data of the {M×N} local data lines in parallel.

12. The semiconductor memory device of claim 11, further comprising M local data inputting/outputting units configured to respectively input/output N-bit data between the {M×N} local data lines and {M×N} global data lines in response to a second input/output strobe signal.

13. The semiconductor memory device of claim 12, wherein the connection selecting unit selectively connects {M÷K} normal data inputting/outputting units and one redundancy data inputting/outputting unit to N local data lines on an N-bit basis.

14. The semiconductor memory device of claim 13, wherein the M normal data inputting/outputting units respectively input/output N-bit data between the M normal cell blocks and {M×N} normal data lines in response to the first input/output strobe signal.

15. The semiconductor memory device of claim 14, wherein the K redundancy data inputting/outputting units respectively input/output N-bit data between the K redundancy cell blocks and {K×N} redundancy data lines in response to the first input/output strobe signal.

16. The semiconductor memory device of claim 15, wherein the connection selecting unit selects 0 to {K×N} repair target normal data lines from among the {M×N} normal data lines in response to the address, and connects {(M−K)×N} normal data lines, other than the repair target normal data line from among the {M×N} normal data lines, and the redundancy data line corresponding to the repair target normal data line from among the {K×N} redundancy data lines, respectively to the {M×N} local data lines.

17. The semiconductor memory device of claim 16, wherein the connection selecting unit comprises:
    a connection selection signal generating unit configured to generate M connection selection signals having logic levels according to the address; and
    M connection controlling units configured to connect normal data lines other than the selected 0 to {K×N} repair target normal data lines from among the {M×N} normal data lines and the 0 to {K×N} redundancy data lines selected from among the {K×N} redundancy data lines, respectively to the {M×N} local data lines on an N-bit basis, in response to the M connection selection signals.

18. The semiconductor memory device of claim 17, wherein the connection selection signal generating unit comprises:
    {K×R} cell block selecting units configured to respectively select {K×R} repair target normal cell blocks from among the M normal cell blocks corresponding to {K×R} redundancy cell lines included in the K redundancy cell blocks;
    {K×R} cell line selecting units configured to compare the address and a repair target address and to respectively select {K×R} repair target normal cell lines, corresponding to the {K×R} redundancy cell lines, from among {M×S} normal cell lines included in the M normal cell blocks, according to the comparison results; and M connection selection signal outputting units configured to respectively determine the logic levels of the M connection selection signals in response to the output signals of the {K×R} cell line selecting units and the {K×R} cell block selecting units, wherein R is a number of normal cell lines corresponding to one normal cell block, and S is a number of redundancy cell lines corresponding to one redundancy cell block.

19. The semiconductor memory device of claim 17, wherein the M connection controlling units comprise:

M first input terminals connected to the {M×N} normal data lines, respectively, on an N-bit basis; and M second input terminals connected to the {K×N} redundancy data lines, respectively, on an N-bit basis, wherein {M×K} second input terminals share one redundancy data line, the {M×N} local data lines are connected respectively to M output terminals on an N-bit basis, and the $\theta$ to K output terminals among the M output terminals are connected to the second input terminal on an N-bit basis in response to the M connection selection signals, and the other output terminals are connected to the first input terminal on an N-bit basis.

20. The semiconductor memory device of claim 16, further comprising:

{M×N} normal data latch units connected respectively to the {M×N} normal data lines to latch data carried in the normal data lines during a first time period corresponding to the input cycle of the address, which is determined by counting clocks from a time point later than the input time point of the address; and {K×N} redundancy data latch units connected respectively to the {K×N} redundancy data lines to latch data carried in the redundancy data lines during the first time period.

21. The semiconductor memory device of claim 20, wherein the first strobe signal is activated during a second time period in each input cycle of the address, which is shorter than the first time period and is determined by counting clocks from a time point later than the input time point of the address, to operate the {M×N} normal data inputting/outputting units and the {K×N} redundancy data inputting/outputting units; and the second strobe signal is activated at the same time point as the first strobe signal or at the later time point than the first strobe signal during the second time period in each input cycle of the address to operate the {M×N} local data inputting/outputting units.

22. A semiconductor memory device having a bank including a plurality of redundancy cell blocks and a plurality of normal cell block groups, each normal cell block group including a number of normal cell blocks, the semiconductor memory device comprising:

a plurality of normal data inputting/outputting groups configured to respectively input/output data from the normal cell block groups in response to a first input/output strobe signal;

a plurality of redundancy data inputting/outputting units configured to input/output data from the redundancy cell blocks in response to the first input/output strobe signal;

a connection selecting unit configured to selectively connect the normal data inputting/outputting groups and the redundancy data inputting/outputting units to a plurality of local data line groups in response to an address, wherein each of the local data line groups includes a predetermined number of local data lines; and a compressive test operation unit connected respectively to a number of local data lines, included in each of the local data line groups, to compressively test the data of the local data lines in parallel.

23. The semiconductor memory device of claim 22, further comprising a plurality of local data inputting/outputting groups configured to respectively input/output data between the local data line groups and a plurality of global data line groups in response to a second input/output strobe signal, wherein each of the global data line groups includes a number of global data lines.

24. The semiconductor memory device of claim 23, wherein each of the normal data inputting/outputting groups includes a number of normal data inputting/outputting units configured to input/output data from a number of normal cell blocks included in each of the normal cell block group.

25. The semiconductor memory device of claim 24, wherein the connection selecting unit selectively connects any one of the redundancy data inputting/outputting units and a number of normal data inputting/outputting units included in any one of the normal data inputting/outputting groups, to a number of local data lines included in any one of the local data line groups, in response to the address.

26. The semiconductor memory device of claim 23, wherein the first strobe signal is activated during a second time period in each input cycle of the address, which is shorter than the first time period and is determined by counting clocks from a time point later than the input time point of the address, to operate the normal data inputting/outputting groups and the redundancy data inputting/outputting units; and the second strobe signal is activated at the same time point as the first strobe signal or at the later time point than the first strobe signal during the second time period in each input cycle of the address to operate the local data inputting/outputting groups.

* * * * *